(12) United States Patent
Miyakawa et al.

(10) Patent No.: US 12,148,469 B2
(45) Date of Patent: Nov. 19, 2024

(54) METHOD FOR MANUFACTURING MEMORY SYSTEM INCLUDING A STORAGE DEVICE

(71) Applicant: KIOXIA CORPORATION, Tokyo (JP)

(72) Inventors: Tadashi Miyakawa, Yokohama Kanagawa (JP); Katsuhiko Hoya, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 352 days.

(21) Appl. No.: 17/682,770

(22) Filed: Feb. 28, 2022

(65) Prior Publication Data

US 2023/0106886 A1 Apr. 6, 2023

(30) Foreign Application Priority Data

Sep. 17, 2021 (JP) .................. 2021-152118

(51) Int. Cl.
| | |
|---|---|
| *H10N 50/01* | (2023.01) |
| *G11C 11/16* | (2006.01) |
| *G11C 13/00* | (2006.01) |
| *H01L 27/10* | (2006.01) |
| *H10B 61/00* | (2023.01) |
| *H10N 50/10* | (2023.01) |
| *H10N 50/80* | (2023.01) |

(52) U.S. Cl.
CPC ........ *G11C 13/0069* (2013.01); *G11C 11/161* (2013.01); *G11C 11/1673* (2013.01); *G11C 11/1675* (2013.01); *G11C 13/0038* (2013.01); *G11C 13/004* (2013.01); *H01L 27/101* (2013.01); *H10B 61/00* (2023.02); *H10N 50/01* (2023.02); *H10N 50/10* (2023.02); *H10N 50/80* (2023.02)

(58) Field of Classification Search
CPC ........ H01L 27/101; H01L 21/77; H10N 50/01
USPC ........................................ 438/3, 95
See application file for complete search history.

(56) References Cited

U.S. PATENT DOCUMENTS

| | | |
|---|---|---|
| 9,812,504 B2 | 11/2017 | Lee |
| 2010/0232208 A1 | 9/2010 | Maejima et al. |
| 2018/0261270 A1 | 9/2018 | Yoshikawa et al. |

(Continued)

FOREIGN PATENT DOCUMENTS

| | | |
|---|---|---|
| JP | 2010218615 A | 9/2010 |
| JP | 2014036034 A | 2/2014 |
| JP | 2021048182 A | 3/2021 |

*Primary Examiner* — Hoai V Pham
(74) *Attorney, Agent, or Firm* — Kim & Stewart LLP (57) ABSTRACT

According to one embodiment, a method for manufacturing a memory system that has memory cells with a variable resistance element and a switching element connected between a first wire and second wire, includes forming the variable resistance elements in the memory system in a low resistance state or a high resistance state, and then bringing each of the variable resistance elements into the low resistance state before performing either of a read operation or a write operation by performing an external initialization process that is different from the read operation and the write operation. In some examples, the variable resistance element can be a magnetoresistance type element and the external initialization process may be exposing the memory cells to an external magnetic field.

20 Claims, 7 Drawing Sheets

(56) References Cited

U.S. PATENT DOCUMENTS

2020/0091409 A1* 3/2020 Ito .................... H10N 50/80
2021/0083004 A1   3/2021 Kimura

* cited by examiner

METHOD FOR MANUFACTURING MEMORY SYSTEM INCLUDING A STORAGE DEVICE

CROSS-REFERENCE TO RELATED APPLICATION(S)

This application is based upon and claims the benefit of priority from Japanese Patent Application No. 2021-152118, filed Sep. 17, 2021, the entire contents of which are incorporated herein by reference.

FIELD

Embodiments described herein relate generally to a method of manufacturing a memory system including a storage device.

BACKGROUND

There is proposed a memory system including a storage device in which, for example, resistance-change type memory elements are integrated on a semiconductor substrate.

DETAILED DESCRIPTION

Embodiments provide a memory system capable of performing a stable initialization operation.

In general, according to one embodiment, a method for manufacturing a memory system that includes memory cells with a variable resistance element and a switching element connected between a first wire and second wire includes forming variable resistance elements in the memory system in a low resistance state or a high resistance state, and then bringing each of the variable resistance elements into the low resistance state before performing either of a read operation or a write operation by performing an external initialization process that is different from the read operation and the write operation.

A memory system according to one embodiment of the present disclosure will be described below with reference to the drawings. In the following description, components having approximately the same functions and configurations are assigned the respective same reference characters, and repetitive description of such components may be omitted. The example embodiments described below are used to illustrate a device or a method embodying a technical concept of the present disclosure. The technical concepts are not restricted to particular materials, shapes, structures, and locations of each component part described in the examples.

In the present disclosure, a direction leading from a word line WL toward a bit line BL is referred to as "up" or "above". On the other hand, a direction leading from a bit line BL toward a word line WL is referred to as "down" or "below". In this way, for explanatory convenience, the terms "above" or "below" are used in the following description, but arrangements a word line WL and a bit line BL are not limited to any particular orientation with respect to the gravity direction, and the word line WL and bit line BL may be disposed to have a vertical positional relationship opposite to the illustrated one in the drawings. Thus, in the following description, an expression such as "a bit line BL above a word line WL" is only intended to explain a positional relationship between the word line WL and the bit line BL.

In the present specification, expressions such as "a includes A, B, or C", "a includes any one of A, B, and C", and "a includes one selected from a group including A, B, and C" do not exclude, unless otherwise expressly stated, a case where a includes combinations of A, B, and C. Additionally, these expressions also do not exclude the possibility of a including a component or than A, B, and/or C.

1. One Embodiment

A memory system 1 according to one embodiment is described with reference to FIG. 1 to FIG. 9. The memory system 1 includes a memory cell array 10, in which a plurality of memory cells MC is arrayed, and a control circuit 40, which controls the memory cells MC.

[1-1. Overall Configuration of Memory System 1]

Figure 1:
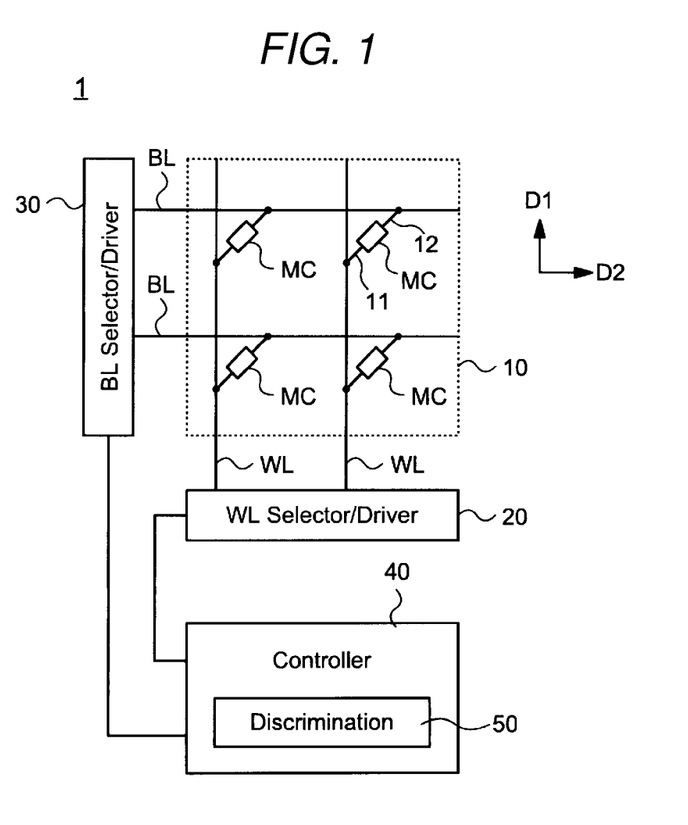
FIG. 1 is a block diagram illustrating an overall configuration of a memory system according to one embodiment.

FIG. 1 is a block diagram illustrating an overall configuration of the memory system 1. As illustrated in FIG. 1, the memory system 1 includes memory cell array 10, a word line selection/driving circuit 20 (captioned as "WL Selector/Driver"), a bit line selection/driving circuit 30 (captioned as "BL Selector/Driver"), and the control circuit 40 (captioned as "Controller").

A plurality of memory cells MC, a plurality of word lines WL, and a plurality of bit lines BL are provided in the memory cell array 10. Each word line WL extends in a direction D1. Each bit line BL extends in a direction D2. Each memory cell MC is between one word line WL and one bit line BL and is electrically connected to the word line WL and the bit line BL. Each memory cell MC is a two-terminal memory cell. A first terminal 11 of each memory cell MC is connected to the word line WL. A second terminal 12 of each memory cell MC is connected to the bit line BL. The word line WL and the bit line BL directions intersect with each other, and the memory cell MC is provided at a position where the word line WL and the bit line BL intersect with each other.

While, in FIG. 1, a configuration in which the direction D1 and the direction D2 are perpendicular to each other is illustrated as an example, the direction D1 and the direction D2 may intersect with each other at an angle different from a right angle. While, in FIG. 1, a configuration in which the word line WL linearly extends in the direction D1 is illustrated as an example, the word line WL does not need to be entirely linear. The word line WL only needs to extend generally in the direction D1 and individual portions may be at an angle to the D1 direction. Similarly, while, a configuration in which the bit line BL linearly extends in the direction D2 is illustrated as an example, the bit line BL does not need to be entirely linear. The bit line BL only needs to extend generally in the direction D2 and individual portions may be at an angle to the D2 direction.

A memory cell MC is targeted for a read or write operation by selection of the corresponding word line WL and bit line BL from the plurality of word lines WL and the plurality of bit lines BL. Specifically, by applying a predetermined voltage to a selected word line WL and a selected bit line BL to cause a predetermined current to flow through a memory cell MC permits a write operation and a read operation on the memory cell MC to be performed.

The word line selection/driving circuit 20 is provided at a position adjacent to the memory cell array 10 in the direction D1. Each word line WL is connected to the word line selection/driving circuit 20.

The bit line selection/driving circuit 30 is provided at a position adjacent to the memory cell array 10 in the direction D2. Each bit line BL is connected to the bit line selection/driving circuit 30.

The control circuit 40 is connected to the word line selection/driving circuit 20 and the bit line selection/driving circuit 30. The control circuit 40 includes a determination circuit 50 (captioned as "Discrimination").

The control circuit 40 performs a write operation and a read operation according to commands from an external device or the like. The control circuit 40 supplies control signals to the word line selection/driving circuit 20 and the bit line selection/driving circuit 30 according to addresses designated in the write operation and the read operation. Responsive to the control signals, the word line selection/driving circuit 20 and the bit line selection/driving circuit 30 select a word line WL and a bit line BL corresponding to the respectively designated addresses, and applies a write voltage or a read voltage to the selected word line WL and bit line BL. In this way, a write operation or a read operation on the memory cell MC is performed.

The determination circuit 50 identifies a data value stored in a memory cell MC based on the voltage for the memory cell MC obtained in the read operation (i.e., a read voltage). Each memory cell MC includes a variable resistance element 101 and is configured to store binary data depending on a resistance state (i.e., a low resistance state or a high resistance state) of the variable resistance element 101. Identification of data stored in the memory cell MC is performed by the determination circuit 50 determining the resistance state of the variable resistance element 101.

[1-2. Configuration of Memory Cell Array 10]

Figure 2:
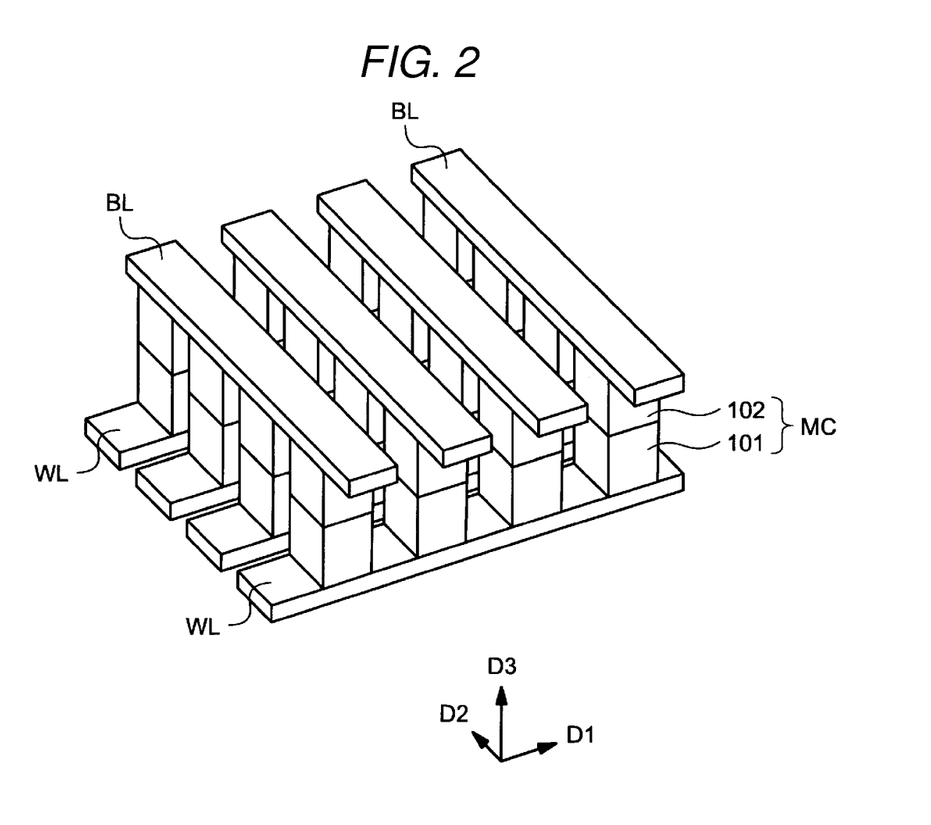
FIG. 2 is a perspective view schematically illustrating a configuration of a memory cell according to one embodiment.

FIG. 2 is a cross-sectional view schematically illustrating a configuration of the memory cell MC according to one embodiment. As illustrated in FIG. 2, the memory cell MC is provided above the word line WL (in a direction D3). The bit line BL is provided above the memory cell MC (in the direction D3). In other words, the memory cell MC is provided in a region between the intersecting word line WL and bit line BL, which are provided in the respective different layers.

The memory cell MC includes the variable resistance element 101 and a switching element 102. The variable resistance element 101 and the switching element 102 are interconnected in series between the word line WL and the bit line BL. The variable resistance element 101 is provided on the side closer to the word line WL, and the switching element 102 is provided on the side closer to the bit line BL.

The variable resistance element 101 is a non-volatile memory element capable of being switched between a high resistance state and a low resistance state. The low resistance state of the variable resistance element 101 is sometimes referred to as a "first low resistance state". The high resistance state of the variable resistance element 101 is sometimes referred to as a "first high resistance state". In the present embodiment, a configuration in which a magnetoresistance effect element including a magnetic tunnel junction (MTJ) is used as the variable resistance element 101 is described. The magnetoresistance effect element is sometimes referred to as an "MTJ element". The MTJ element is a memory element in which a resistance (tunnel magnetoresistance) caused by a tunnel effect in an insulating layer varies depending on a relationship between respective magnetization directions of two magnetic layers adjacent to each other across the insulating layer. The MTJ element can have a plurality of resistance states (resistance values) according to a relative relationship between the direction of magnetization of one magnetic layer and the direction of magnetization of the other magnetic layer (magnetization array).

The switching element 102 is a two-terminal element. The switching element 102 is switched to a low resistance state or a high resistance state according to voltages applied to two terminals thereof. The low resistance state of the switching element 102 is sometimes referred to as a "second low resistance state". The high resistance state of the switching element 102 is sometimes referred to as a "second high resistance state". The resistance in the second low resistance state is lower than the resistance in the first low resistance state of the variable resistance element 101. The resistance in the second high resistance state is higher than the resistance in the first high resistance state of the variable resistance element 101. Thus, when the switching element 102 is in the second high resistance state, the resistance of the memory cell MC is determined primarily by the resistance of the switching element 102. On the other hand, when the switching element 102 is in the second low resistance state, the resistance of the memory cell MC is determined primarily by the resistance of the variable resistance element 101.

Unlike the configuration illustrated in FIG. 2, the variable resistance element 101 may be provided on the side closer to the bit line BL and the switching element 102 may be provided on the side closer to the word line WL. The word line WL may be provided above the switching element 102 (in the direction D3) and the bit line BL may be provided below the variable resistance element 101. Another material or element may be provided between the word line WL and the variable resistance element 101. Similarly, another material or element may be provided between the bit line BL and the switching element 102.

A variable resistance element other than MTJ elements may be used as the variable resistance element 101. For example, a magnetoresistance memory element (magnetoresistance random-access memory (MRAM)), a resistance change type memory element (resistive random-access memory (ReRAM)), a ferroelectric memory (ferroelectric random-access memory (FeRAM)), an organic memory, and a phase-change memory element (PRAM), which are other than MTJ elements, may be used as the variable resistance element 101.

[1-3. Configuration of MTJ Element]

Figure 3:
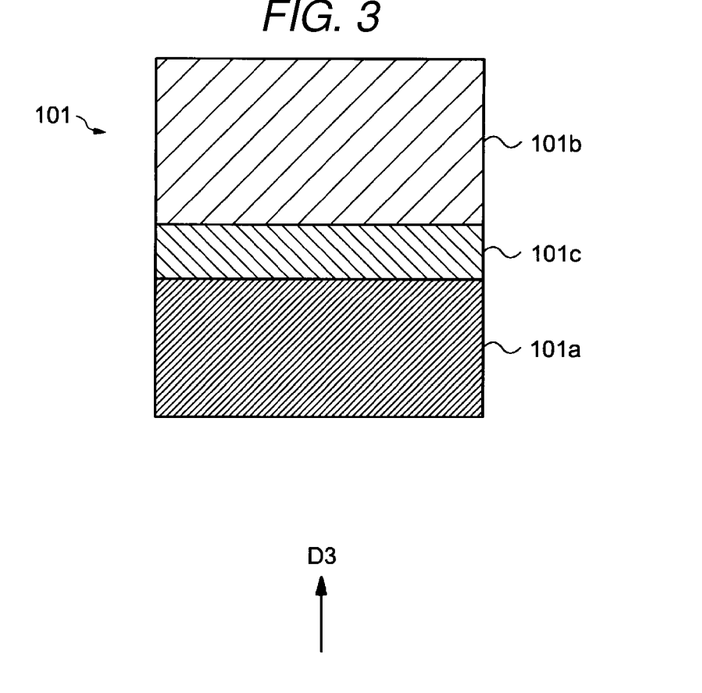
FIG. 3 is a cross-sectional view schematically illustrating a configuration of a variable resistance element according to one embodiment.

FIG. 3 is a cross-sectional view schematically illustrating a configuration of the variable resistance element 101 according to one embodiment. As illustrated in FIG. 3, the MTJ element, which is used as the variable resistance element 101 in this example, includes a storage layer 101a, a reference layer 101b, and a tunnel barrier layer 101c. The storage layer 101a is a ferromagnetic layer having a first magnetic property. The reference layer 101b is a ferromagnetic layer having a second magnetic property. The tunnel barrier layer 101c is a non-magnetic layer. The magnetization direction of the storage layer 101a is variable. The magnetization direction of the reference layer 101b is fixed. The magnetization direction of the storage layer 101a is changed by a write current supplied to the storage layer 101a. The magnetization direction of the storage layer 101a is determined by the direction of the write current. Additionally, the magnetization direction of the storage layer 101a is determined by a magnetic field supplied from outside the memory cell array 10. On the other hand, the magnetization direction of the reference layer 101b is not varied even if a write current is supplied to the reference layer 101b and even if a magnetic field is supplied thereto. The tunnel barrier layer 101c is an insulating layer.

When the magnetization direction of the storage layer 101a is parallel to the magnetization direction of the reference layer 101b (i.e., when the magnetization directions are the same direction), the MTJ element is in a low resistance state. When the magnetization direction of the storage layer 101a is anti-parallel to the magnetization direction of the reference layer 101b (i.e., when the magnetization directions are opposite directions), the MTJ element is in a high resistance state. In this way, since the resistance state (a low resistance state or a high resistance state) of the storage layer 101a is controlled by the magnetization direction thereof, the MTJ element can store binary data based on resistance state.

The storage layer 101a comprises iron (Fe) and cobalt (Co). Additionally, the storage layer 101a may include boron (B). The reference layer 101b may include a lower layer portion and an upper layer portion. In that case, the lower layer portion comprises Fe and Co. Additionally, the lower layer portion may include B. One example of the upper layer portion comprises at least one of cobalt (Co), platinum (Pt), nickel (Ni), and palladium (Pd). One example of the tunnel barrier layer 101c comprises magnesium (Mg) and oxygen (O).

While a configuration in which a bottom free type MTJ element with the storage layer 101a provided below the reference layer 101b is used as the variable resistance element 101 is illustrated as an example in FIG. 3, the present disclosure is not limited to this. A top free type MTJ element with the storage layer 101a provided above the reference layer 101b may be used as the variable resistance element 101. The MTJ element may further include a shift cancelling layer which cancels a magnetic field applied from the reference layer 101b to the storage layer 101a.

[1-4. Configuration of Switching Element 102]

Figure 4:
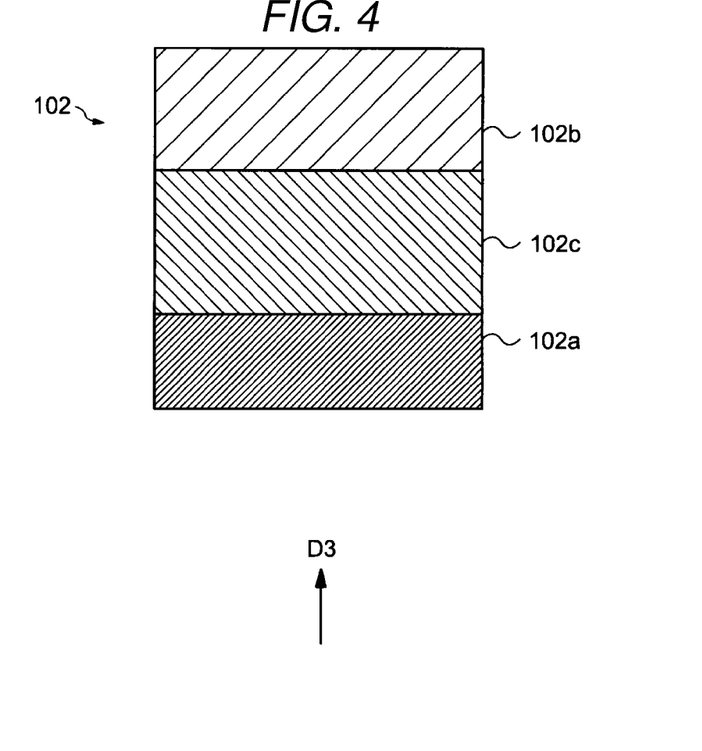
FIG. 4 is a cross-sectional view schematically illustrating a configuration of a switching element according to one embodiment.

FIG. 4 is a cross-sectional view schematically illustrating a configuration of the switching element 102 according to one embodiment. As illustrated in FIG. 4, the switching element 102 includes a lower electrode 102a, an upper electrode 102b, and an intermediate layer 102c. The intermediate layer 102c is between the lower electrode 102a and the upper electrode 102b.

An electrical conducting material is used as the lower electrode 102a. For example, an electrical conducting material comprising at least one of iridium (Ir) and ruthenium (Ru) is used as the lower electrode 102a. In this case, the lower electrode 102a may including oxygen. Specifically, the lower electrode 102a may be formed from an iridium (Ir) layer, an iridium oxide ($IrO_2$) layer, a ruthenium (Ru) layer, a ruthenium oxide ($RuO_2$) layer, or a strontium ruthenium oxide ($SrRuO_3$) layer.

An electrical conducting material is used as the upper electrode 102b. For example, an electrical conducting material comprising at least one of Ir and Ru is used as the upper electrode 102b. In this case, the upper electrode 102b may include oxygen. Specifically, the upper electrode 102b may be an Ir layer, an $IrO_2$ layer, an Ru layer, an $RuO_2$ layer or an $SrRuO_3$ layer. The upper electrode 102b may be the same material as the lower electrode 102a or may be a material different from the lower electrode 102a.

An insulating material is used as the intermediate layer 102c. For example, an insulating material comprising silicon (Si) and oxygen (O) is used. In this case, the intermediate layer 102c may be formed from, for example, a non-stoichiometric silicon oxide (e.g., a Si-rich silicon oxide) larger having a silicon composition ratio greater a stoichiometric proportion (Si:O=1:2). Alternatively, the intermediate layer 102c may be a silicon oxide including arsenic (As) as a dopant. While the intermediate layer 102c is basically an insulating layer having insulating properties, the resistance thereof actually varies according to a voltage applied to the switching element 102.

[1-5. Electrical Characteristics of Switching Element 102]

Figure 5:
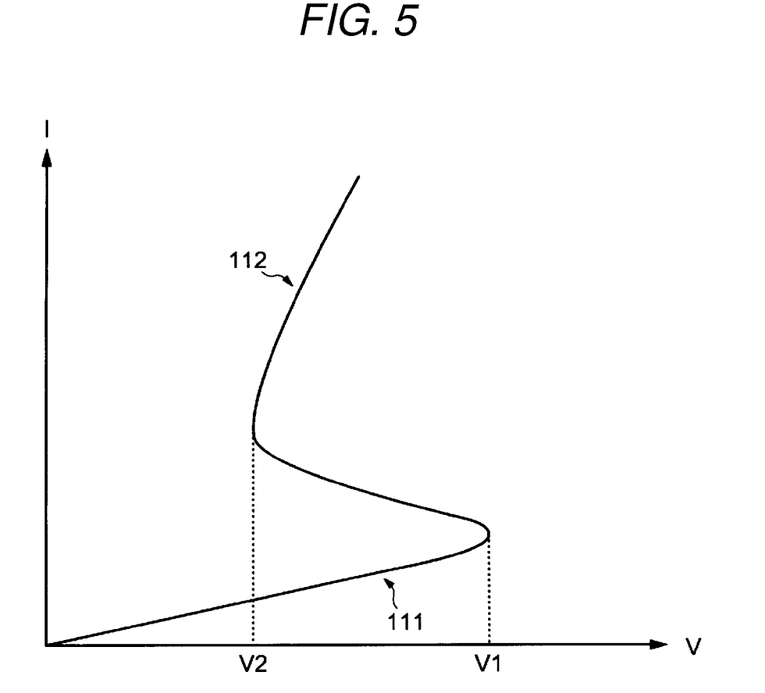
FIG. 5 is a diagram illustrating electrical characteristics of a switching element according to one embodiment.

FIG. 5 is a diagram illustrating electrical characteristics of the two-terminal type switching element 102 according to one embodiment. With a two-terminal switching element having electrical characteristics as illustrated in FIG. 5, the current rapidly decreases at a voltage V1 and, in association with this, the applied voltage rapidly decreases to a voltage V2 and the current increases (in other words, snap back). A material composition to be used for a switching element having such characteristics can be selected and used as appropriate according to the characteristics of the memory cell MC.

As illustrated in FIG. 5, when the voltage applied between the lower electrode 102a and the upper electrode 102b increases and reaches the voltage V1, the switching element 102 is switched from a high resistance state to a low resistance state. Thus, the switching element 102 switches from a high resistance mode 111 to a low resistance mode 112 when the voltage V1 is reached. On the other hand, when the voltage applied between two electrodes decreases and reaches the voltage V2, the switching element 102 is switched from the low resistance state to the high resistance state.

The switching element 102 being switched to the low resistance state by a predetermined voltage being applied between the word line WL and the bit line BL enables a write operation and a read operation to be performed on the variable resistance element 101.

With respect to a switching element 102 in which a silicon oxide is used as a material of the intermediate layer 102c, processing (forming processing) is first performed to form a conductive path. Specifically, the processing is performed by applying a high voltage (referred to as a forming voltage) between the lower electrode 102a and the upper electrode 102b. The forming process results in a filament of silicon nanoclusters being formed inside the intermediate layer 102c. The filament becomes a conductive path, so that the low resistance state of the intermediate layer 102c is obtained. When the applied voltage becomes less than the voltage V1, the silicon nanoclusters are bound to surrounding oxygen and thus return to SiO$_2$, so that the intermediate layer 102c enters a high resistance state. As the forming voltage, a voltage higher than threshold voltage Vth required for switching the switching element 102 obtained after the forming processing from a high resistance state to a low resistance state is required.

[1-6. Electrical Characteristics of Memory Cell MC]

Figure 6:
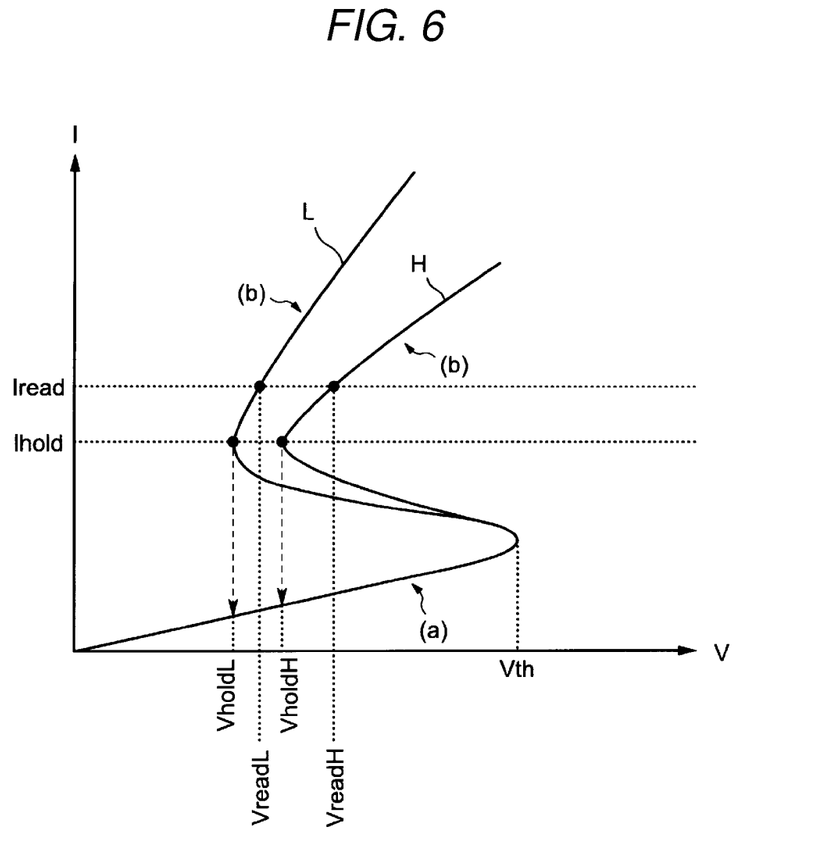
FIG. 6 is a diagram illustrating electrical characteristics of a memory cell during a read operation according to one embodiment.

FIG. 6 is a diagram schematically illustrating electrical characteristics of a selected memory cell MC at the time of a read operation. In FIG. 6, the horizontal axis indicates a voltage between two terminals of the selected memory cell MC (voltage between the word line WL and the bit line BL), and the vertical axis indicates a current which flows through the selected memory cell MC. A characteristic "line L" is obtained when the variable resistance element 101 is in a low resistance state. A characteristic "line H" is obtained when the variable resistance element 101 is in a high resistance state. The electrical characteristics of the memory cell MC illustrated in FIG. 6 are electrical characteristics obtained after the forming processing has been performed.

As mentioned above, the resistance of the switching element 102 obtained in a high resistance state after the forming processing is sufficiently higher than the resistance of the variable resistance element 101 obtained in a high resistance state. In this case, the resistance of the memory cell MC is determined primarily by the resistance of the switching element 102. Accordingly, the electrical characteristics of the memory cell MC obtained before the switching element 102 is switched from a high resistance state to a low resistance state, which corresponds to a characteristic line portion "(a)" that has no substantial difference between the low resistance state and the high resistance state. Thus, after the forming processing, the voltage which is being applied to between two terminals of the memory cell MC when the switching element 102 is switched from the high resistance state to the low resistance state (i.e., the threshold voltage Vth) makes no substantial difference between when the switching element 102 in the low resistance state or the high resistance state.

However, since the resistance of the switching element 102 in the low resistance state is less than the resistance of the variable resistance element 101 in the low resistance state, after the switching element 102 is switched from the high resistance state to the low resistance state, the resistance of the memory cell MC is strongly affected by the resistance of the variable resistance element 101. Accordingly, the electrical characteristics of the memory cell MC obtained after the switching element 102 is switched from a high resistance state to a low resistance state, which corresponds to a characteristic line portion "(b)", differ when the variable resistance element 101 is in the low resistance state and in the high resistance state. Specifically, with regard to a gradient of voltage-current in the characteristic line portion "(b)", the gradient obtained when the variable resistance element 101 is in the high resistance state (characteristic line "H") is smaller than the gradient obtained when the variable resistance element 101 is in the low resistance state (characteristic line "L").

Figure 7:
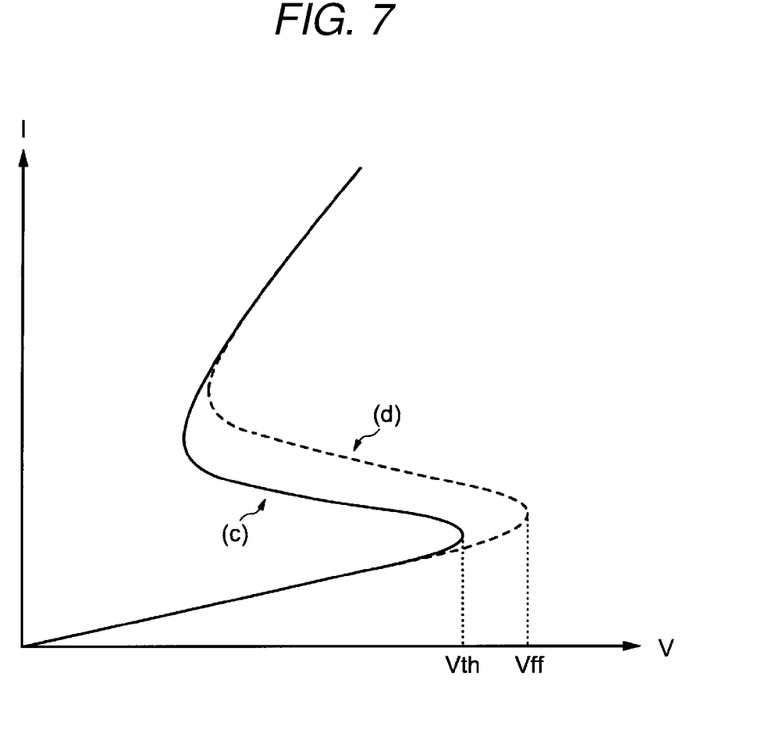
FIG. 7 is a diagram illustrating electrical characteristics of a memory cell before and after a forming processing according to one embodiment.

Here, a difference in electrical characteristics of the memory cell MC between before and after the forming processing is described with reference to FIG. 7. FIG. 7 is a diagram illustrating electrical characteristics of the memory cell MC obtained before and after the forming processing according to one embodiment. A characteristic line "(c)" (indicated by a solid line) illustrated in FIG. 7 is an electrical characteristic of the memory cell MC obtained after the forming processing as with FIG. 6. A characteristic line "(d)" (indicated by a dashed line) illustrated in FIG. 7 is an electrical characteristic of the memory cell MC obtained before the forming processing.

If the memory cell MC has not yet been supplied with forming electricity, a filament (i.e., a conductive path) will not yet be formed inside the intermediate layer 102c of the switching element 102. Therefore, a high voltage is required to be applied for forming a conductive path. Thus, as illustrated in FIG. 7, a forming voltage Vff on the electrical characteristic line "(d)" obtained at the time of the forming processing is larger than a threshold voltage Vth in the electrical characteristic line "(c)" obtained after the forming processing. Additionally, when the memory cell MC has not yet been supplied with electricity, the magnetization directions of the storage layer 101a and the reference layer 101b of the variable resistance element 101 are random, so that the variable resistance element 101 is in a high resistance state.

The overall resistance of the memory cell MC is a series resistance (sum) of the variable resistance element 101 and the switching element 102. Accordingly, if the forming processing is performed with the variable resistance element 101 in a high resistance state, to apply a voltage required for the forming processing to the switching element 102, a high voltage is also applied to the variable resistance element 101. If a high voltage is applied to the variable resistance element 101 in this way, in some cases, the memory cell MC may be destroyed.

In the present embodiment, the variable resistance elements 101 are made uniformly in the low resistance state by performing initialization processing, which is a method different from a read operation or a write operation. Since making the variable resistance elements 101 uniform in the low resistance state results in most of the voltage applied to the memory cell MC being applied to the switching element 102 as a divided voltage, it is possible to make the forming voltage Vff smaller.

For example, when the MTJ element is used as the variable resistance element 101, the initialization processing includes supplying a magnetic field from outside the memory cell array 10 to the variable resistance element 101. For example, by physically introducing the memory cell array 10 into a magnetizing device just after fabrication ("front-end processing") but at least before powering on (supplying electrical power to) the magnetization direction of the storage layer 101a in the MTJ elements can be made uniform. Employing this method enables bringing all of the MTJ elements provided in the memory cell array 10 uniformly into a low resistance state.

As illustrated in FIG. 6, with respect to a read current Iread in the read operation, a read voltage obtained when the variable resistance element 101 is in the low resistance state is VreadL, and a read voltage obtained when the variable resistance element 101 is in the high resistance state is VreadH. The read voltage VreadL is smaller than the read voltage VreadH. This difference in voltage can be used as a basis to determine a resistance state (a low resistance state or a high resistance state) of the variable resistance element 101.

In FIG. 6, a hold current Ihold is a current which flows through the memory cell MC when the switching element 102 is switched from the low resistance state to the high resistance state. A hold voltage Vhold is a voltage across the two terminals of the memory cell MC when the hold current Ihold flows through the memory cell MC. The hold voltage obtained when the variable resistance element 101 is in the low resistance state is VholdL. The hold voltage obtained when the variable resistance element 101 is in the high resistance state is VholdH. Each of these hold voltages VholdL and VholdH is simply referred to as a "hold voltage Vhold" unless required to be specifically distinguished.

When performing a read operation, a difference in potential between the bit line BL and the word line WL is made larger than or equal to the threshold voltage Vth by performing charging of the bit line BL connected to a memory cell MC that is targeted for the read operation and changing the potential of the word line WL, so that the switching element 102 is switched from the high resistance state to the low resistance state. In response to the switching element 102 being switched to the low resistance state, electric charge charged on the bit line BL flows to the word line WL via the memory cell MC, so that the potential of the bit line BL lowers.

In response to the potential of the bit line BL becoming smaller than the hold voltage Vhold, the switching element 102 is switched from the low resistance state to the high resistance state, so that the potential of the bit line BL becomes stable. When the variable resistance element 101 is in the low resistance state, the potential of the bit line BL becomes stable at the hold voltage VholdL. When the variable resistance element 101 is in the high resistance state, the potential of the bit line BL becomes stable at the hold voltage VholdH. Detecting such a potential of the bit line BL enables detecting the resistance state of the variable resistance element 101.

[1-7. Functional Configuration of Determination Circuit 50]

Figure 8:
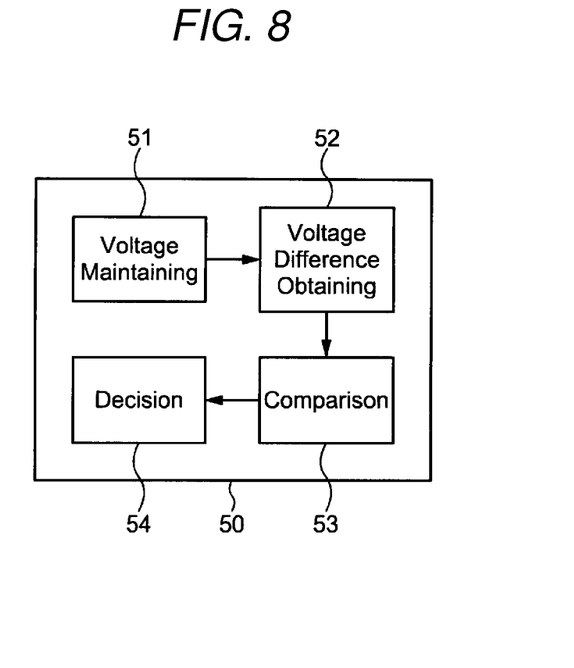
FIG. 8 is a block diagram illustrating a functional configuration of a determination circuit provided in a memory system according to one embodiment.

FIG. 8 is a block diagram illustrating a functional configuration of the determination circuit 50 provided in the memory system 1 according to one embodiment. As illustrated in FIG. 8, the determination circuit 50 includes a voltage maintaining unit 51, a voltage difference obtaining unit 52, a comparison unit 53, and a decision unit 54.

The voltage maintaining unit 51 maintains, as the determined voltage of the target (selected) memory cell MC, a read voltage (VreadL or VreadH) obtained by a read operation on the memory cell MC. In this way, a read operation for data stored in the memory cell MC is sometimes referred to as a "first read operation". The determined voltage of the selected memory cell MC is sometimes referred to as a "first target voltage".

Additionally, the voltage maintaining unit 51 maintains a reference voltage for use in performing data determination based on the determined voltages. In this context, the reference voltage is obtained by a second read operation, which is performed after the first read operation. The reference voltage is sometimes referred to as a "second target voltage". A write operation on the variable resistance element 101 is performed after the first read operation, and then the second read operation is performed after the variable resistance element 101 is switched to the low resistance state or the high resistance state. A resistance state of the variable resistance element 101 obtained when the first read operation is performed is sometimes referred to as a "determination target resistance state", and a resistance state of the variable resistance element 101 obtained when the second read operation is performed is sometimes referred to as a "reference resistance state".

The voltage difference obtaining unit 52 acquires a voltage difference between the determined target voltage and the reference voltage, both of which are kept by the voltage maintaining unit 51.

The comparison unit 53 compares the voltage difference acquired by the voltage difference obtaining unit 52 to a reference voltage difference. The reference voltage difference is, for example, a value obtained by multiplying the difference between the read voltage VreadL and the read voltage VreadH by one-half (½).

The decision unit 54 identifies the resistance state of the variable resistance element 101 based on the comparison by the comparison unit 53. Specifically, when the voltage difference between the determined target voltage and the reference voltage is less than the reference voltage difference, the decision unit 54 determines that the resistance state of the variable resistance element 101 is the same as the reference resistance state. When the voltage difference between the determined target voltage and the reference voltage is greater than the reference voltage difference, the decision unit 54 determines that the resistance state of the variable resistance element 101 is different from the reference resistance state. Furthermore, the determination circuit described above is merely one example, and a circuit design other than the above-described determination circuit may be used to identify data stored in the memory cells MC. For example, without use of a reference voltage, identification of data in the memory cell MC may be performed directly from the read voltage.

[1-8. Method for Manufacturing Memory System 1]

Figure 9:
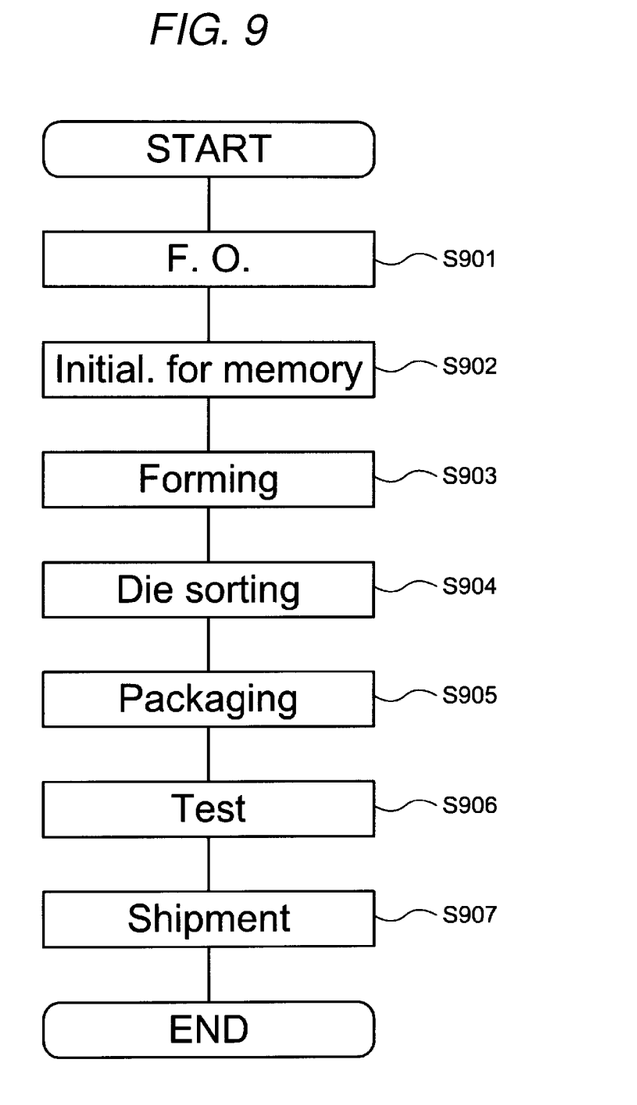
FIG. 9 is a flowchart illustrating a method of manufacturing a memory system according to one embodiment.

FIG. 9 is a flowchart illustrating a method for manufacturing a memory system 1 according to one embodiment. FIG. 9 is a flowchart illustrating a method for manufacturing a memory system in which an MTJ element is used as the variable resistance element 101.

In step S901, a fabrication process for a semiconductor storage device ends. The fabrication process (manufacturing process) ending is sometimes referred to as "fab out" (or "F. O."). Specifically, referring to FIG. 1, at the end of the fabrication process, the memory cell array 10, the word line selection/driving circuit and 20, the bit line selection/driving circuit 30 have been formed. In this process, a silicon wafer is typically used as a substrate, and a plurality of semiconductor storage devices are formed on the substrate as individual dies or the like on the substrate.

Next, in step S902, initialization processing of the variable resistance elements 101 ("Initial. for memory") is performed. In step S902, a silicon wafer with a plurality of semiconductor storage devices formed thereon is introduced into a magnetizing device. Thus, magnetizing processing is collectively performed on the plurality of semiconductor storage devices at the same time. That is, in the magnetizing device, a magnetic field is supplied to the silicon wafer as whole.

A plurality of semiconductor storage devices provided on the silicon wafer and a plurality of variable resistance elements 101 are thus made uniformly to be in a low resistance state by the initialization processing. While the low resistance state of the variable resistance element 101 is the same state as the low resistance state obtained by a write operation, in the case of the initialization processing, before the first write operation is performed, the variable resistance element 101 is switched to the low resistance state by a method different from a write operation.

In step S903, forming processing for the switching element 102 is performed. For example, the forming processing is performed by, for example, connecting a probe terminal to a control pad connected to the word line selection/driving circuit 20 and the bit line selection/driving circuit 30 and transmitting a control signal from the outside to the probe terminal to control the word line selection/driving circuit 20 and the bit line selection/driving circuit 30. Alternatively, the forming processing may be performed with use of, for example, an internal circuit provided in the memory system 1, such as the control circuit 40.

Next, in step S904, a die sorting process is performed. In this process, the silicon wafer is divided into individual semiconductor storage devices by, for example, a dicer. While, in the present embodiment, the initialization processing of the variable resistance element 101 is performed before the substrate is divided, the initialization processing may instead be performed after the die sorting process, in other words, after the substrate is divided into individual semiconductor storage devices.

Next, in step S905, a packaging process of the memory system is performed. Then, after selection of good products and defective products is performed through a test process in step S906, shipment of the memory system(s) 1 is performed in step S907.

Performing the initialization processing on the variable resistance element 101 before the forming processing (S903) for the switching element 102 allows the forming voltage Vff to be smaller. As a result, it is possible to prevent (or reduce the chance of) the variable resistance element 101 being destroyed due to a high voltage being applied to the variable resistance element 101 during the forming processing.

While a configuration in which an MTJ element is used as the variable resistance element 101 and magnetizing processing is performed as initialization processing of the variable resistance element 101 is illustrated as an example, the present disclosure is not limited to this configuration. The initialization processing only needs to be processing capable of bringing the resistance state of the variable resistance elements 101 into a low resistance state, and can be selected as appropriate in conformity with characteristics of the variable resistance elements 101.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a memory system including memory cells with a variable resistance element and a switching element connected between a first wire and second wire, the method comprising:
    forming variable resistance elements in the memory system in a low resistance state or a high resistance state; and
    bringing each of the variable resistance elements into the low resistance state before performing either of a read operation or a write operation by performing an external initialization process that is different from the read operation and the write operation.

2. The method according to claim 1, wherein the external initialization process is an exposure of the memory system to a magnetic field within an external device.

3. The method according to claim 1, wherein the variable resistance elements are magnetic tunnel junction elements.

4. The method according to claim 1, wherein the external initialization process is simultaneously performed within an external device on a plurality of memory systems.

5. The method according to claim 4, wherein the plurality of memory systems are disposed on one semiconductor wafer.

6. The method according to claim 5, further comprising:
    dicing the semiconductor wafer to separate the plurality of memory systems from one another.

7. The method according to claim 6, further comprising:
    after the dicing, packaging the plurality of memory systems.

8. The method according to claim 4, wherein the external initialization process is an exposure of the plurality of memory systems to a magnetic field.

9. The method according to claim 1, wherein
    the variable resistance element and the switching element are interconnected in series, and
    the switching element can be switched according to a voltage applied thereto between a low resistance state that is lower in resistance than the low resistance state of the variable resistance element or a high resistance state that is higher in resistance than the high resistance state of the variable resistance element.

10. The method according to claim 1, wherein
    the variable resistance element is a magnetoresistance effect element, and
    the external initialization process is supplying a magnetic field from outside of the memory system to the magnetoresistance effect element.

11. The method according to claim 10, wherein the external initialization process brings the magnetoresistance effect element into the low resistance state.

12. The method according to claim 1, further comprising:
    applying a forming voltage to each of the switching elements in the memory system after performing the external initialization process on the variable resistance elements.

13. A method for manufacturing a memory system, the method comprising:
    forming a plurality of semiconductor storage devices on a substrate, each semiconductor storage device including:
        a first wiring extending in a first direction;
        a second wiring extending in a second direction intersecting with the first direction; and
        a memory cell including a variable resistance element and a switching element connected between the first wiring and the second wiring;
    placing the variable resistance elements of the plurality of storage devices into a low resistance state by performing an initialization process on the variable resistance elements before dicing the substrate into individual semiconductor storage devices.

14. The method according to claim 13, further comprising:
    applying a forming voltage to the switching elements after performing the initialization process on the variable resistance elements.

15. The method according to claim 13, wherein
    the variable resistance element and the switching element within each memory cell are interconnected in series, and
    the switching elements can be switched to a low resistance state or a high resistance state higher according to a voltage applied thereto.

16. The method according to claim 13, wherein
    the variable resistance elements are magnetoresistance effect elements, and the initialization process is supplying an external magnetic field to the magnetoresistance effect elements.

17. A method of manufacturing memory devices, the method comprising:
- forming a plurality of memory cells in a plurality of dies on a semiconductor wafer, the memory cells including a magnetoresistance effect element and a switching element connected in series, the switching element requiring a forming voltage to be applied thereto before reading and writing operations are performed on the memory cell;
- exposing the semiconductor wafer to an external magnetic field to place the magnetoresistance effect elements in a low resistance state;
- applying the forming voltage to the switching elements after the exposing of the semiconductor wafer to the external magnetic field; and
- dicing the semiconductor wafer to separate individual memory devices from one another.

18. The method according to claim 17, wherein the forming voltage is applied before the dicing of the semiconductor wafer.

19. The method according to claim 17, further comprising:
- packaging the individual memory devices.

20. The method according to claim 19, further comprising:
- testing the packaged memory device.

* * * * *